United States Patent [19]

Yanagawa et al.

[11] Patent Number: 4,795,962
[45] Date of Patent: Jan. 3, 1989

[54] FLOATING DRIVER CIRCUIT AND A DEVICE FOR MEASURING IMPEDANCES OF ELECTRICAL COMPONENTS

[75] Inventors: Kouichi Yanagawa; Kazuyuki Yagi, both of Hachiojishi, Japan

[73] Assignee: Hewlett-Packard Company, Palo Alto, Calif.

[21] Appl. No.: 93,845

[22] Filed: Sep. 4, 1987

[30] Foreign Application Priority Data

Sep. 4, 1986 [JP] Japan ................................ 61-208668

[51] Int. Cl.$^4$ .......................................... G01R 27/00
[52] U.S. Cl. .................... 324/57 R; 307/270
[58] Field of Search ............... 324/57 R, 57 H; 330/297, 273; 307/270

[56] References Cited

U.S. PATENT DOCUMENTS 3,576,490 4/1971 Nishino .......................... 324/57 R
3,651,400 3/1972 McMartin et al. ............... 324/57 R Primary Examiner—Reinhard J. Eisenzopf
Assistant Examiner—Anthony L. Miele
Attorney, Agent, or Firm—Patrick J. Barrett

[57] ABSTRACT

A floating driver circuit. A power supply is connected through a signal source to an amplifier's input terminal. The power supply is also connected to a pair of power supply terminals of the amplifier, via at least one resistor for each power supply terminal, so that direct current flows from the power supply into the power supply terminals. Further, at least one capacitor is connected to each power supply terminal. A cable, preferably coaxial, has first and second conductors. The first conductor is connected to a signal output terminal of the amplifier. The second conductor is connected to the power supply terminals through the capacitors. A pair of these circuits is combined at opposite ends of an electrical component to enable measurement of the impedances thereof.

17 Claims, 3 Drawing Sheets

FLOATING DRIVER CIRCUIT AND A DEVICE FOR MEASURING IMPEDANCES OF ELECTRICAL COMPONENTS

This invention relates to a floating driver circuit which does not require a transformer and to a device for measuring impedance of electrical components.

BACKGROUND OF THE INVENTION

This invention relates to a low-cost floating driver circuit which is capable of reducing common-mode transmission over a wide range of frequencies in a signal transmission cable. The floating driver circuit of the invention, though not limited thereto, is particularly advantageous for driving a measurement device through a cable in impedance measurements.

PRIOR ART AND PROBLEMS

Many such systems connect measurement devices through cables and measure electrical parameters of such devices—that is, they measure impedance, transmission, gain, etc. In such systems, it is very important to eliminate interference between cables in order to conduct a highly accurate measurement.

An example is a four-terminal pair measurement, where there is a problem when an impedance value is computed from a voltage across a current-driven test device.

Where a cable driving current to a device and a cable for measuring voltages are coupled through mutual inductance, the magnitude of the voltage is equal to the magnitude of the inductance times the magnitude of the drive current, and this causes measurement errors.

To solve this problem, there has been an endeavor to use a coaxial structure for all the cables connected to the element under test and to make the currents through the center conductor and the outer conductor of the coaxial cable have equal magnitudes and flows mutually opposite in direction. When this is implemented, magnetic flux emanating outwardly from the cables is eliminated, and, accordingly, no mutual interference exists.

A driver circuit to accomplish the above-mentioned objective is called a "floating driver circuit."

In the prior art, floating driver circuits relied heavily on the use of transformers in order to suppress common-mode signals. As a result the usable relative bandwidth was limited to about 3.5 decades. Also, the transformers were relatively expensive.

OBJECTS OF THE INVENTION

Accordingly, an object of the invention is to provide a low-cost floating driver circuit.

Another object is to provide a low-cost floating driver circuit that is usable over a wide range of frequencies.

Another object is to provide a floating driver circuit that has no transformers.

Other objects and advantages of the invention will appear from the following descriptions.

DESCRIPTION OF TWO TYPES OF PRIOR-ART FLOATING DRIVER CIRCUITS

Figure 5:
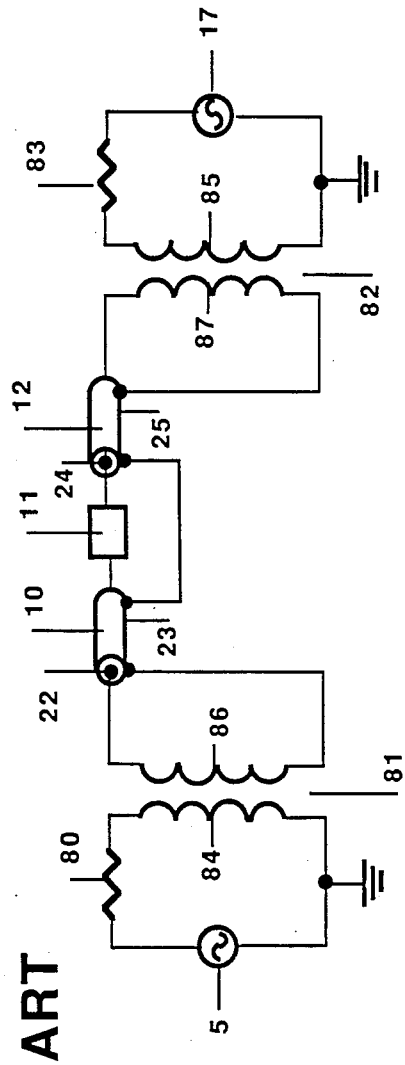
FIG. 5 is a circuit diagram of a prior-art type of floating driver circuit, using transformers.
Figure 6:
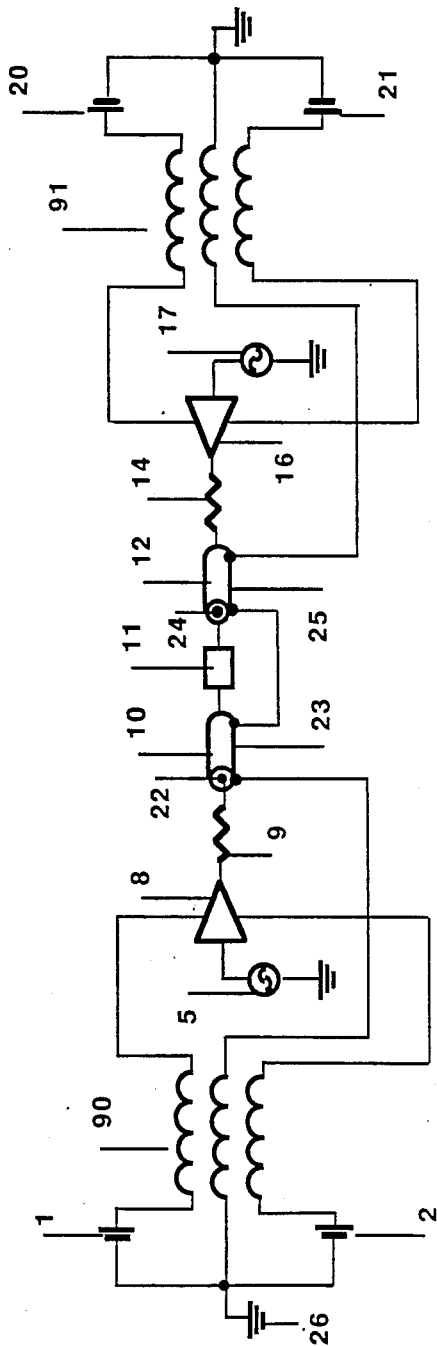
FIG. 6 is a circuit diagram of another prior-art type of floating driver circuit, also using transformers.

A prior-art floating driver circuit of this type, as applied in an impedance measuring instrument, is depicted in FIGS. 5 and 6, showing two different prior art circuits.

A first prior-art driver circuit (FIG. 5) impressed signal current from signal sources 5 and 17 on primary windings 84 and 85 of transformers 81 and 82 through resistors 80 and 83 respectively. Currents produced in the secondary windings 86 and 87 of the transformers 81 and 82 were input to center conductors 22 and 24 of coaxial cables 10 and 12 and were returned through their corresponding outer conductors 23 and 25. At the ends of the coaxial cables 10 and 12 farthest from the transformers 81 and 82, the outer conductors 23 and 25 of the cables 10 and 12 were mutually connected, and a device 11 under test was connected between the center conductors 22 and 24.

Coaxial cables for measuring the voltages between both terminals of the device under test and the outer conductor of the cable have been omitted without changing the scope of the detailed description of the invention.

In a second prior-art device, depicted in FIG. 6, each signal voltage from the signal sources 5 and 17 was introduced to each of two corresponding center conductors 22 and 24 of the coaxial cables 10 and 12 through each of corresponding high-input impedance amplifiers 8 and 16 and their output resistors 9 and 14, respectively.

On the other hand, the outer conductor 23 of the coaxial cable 10 and the supply lines of the amplifier 8 were wound on a magnetic core, both in the same direction, and formed a common-mode choke 90 to earth (i.e., grounded). There were no current flows from the amplifier 8 to earth; so common-mode signals through the coaxial cable 10 were, accordingly, all eliminated. As a result, currents flowing through the center conductor 22 and the outer conductor 23 of the cable 10 were the same in magnitude while opposite in direction, causing no magnetic field outside of the cable 10.

Prior art circuitry of this type suffered from the following two problems resulting from usage of transformers to suppress common mode signals: The first problem was to limit the usable relative bandwidth in performance to approximately 3.5 decades, because of restrictions on structures and structural materials of the transformers. The second problem was the high cost resulting from the structural components and the manufacturing technology applied to transformers.

General Description of Preferred Embodiments of the Invention

Figure 1:
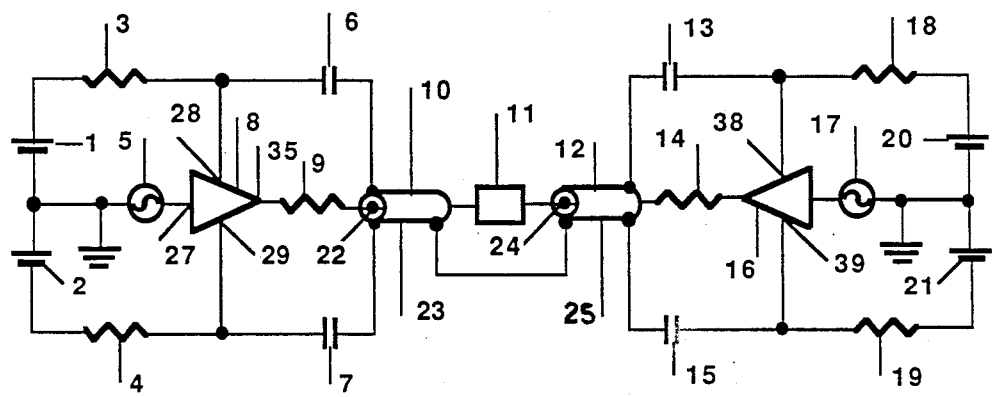
FIG. 1 is a circuit diagram of a floating driver circuit embodying the principles of the invention.
Figure 2:
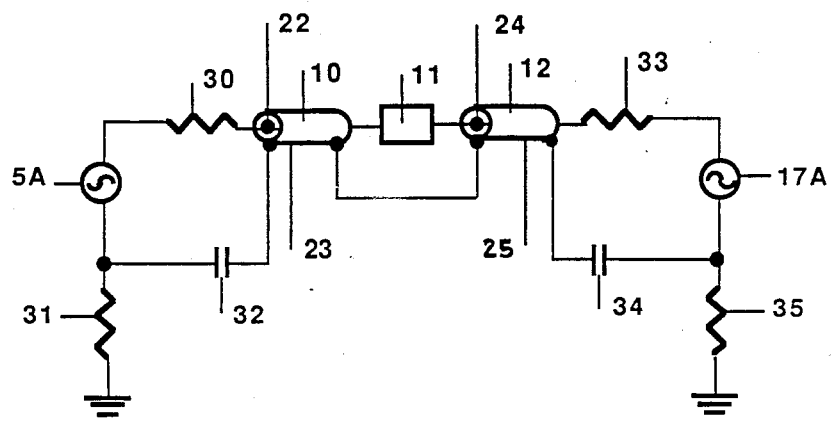
FIG. 2 is a circuit diagram of a simplified, equivalent circuit corresponding to FIG. 1.

The circuit of FIGS. 1 and 2

According to one embodiment of the present invention (FIGS. 1 and 2) the center conductor 22 or 24 of the coaxial cable 10 or 12 is driven directly or through an output resistor by a high-input impedance amplifier 8 or 16 amplifying a signal. An outer conductor 23 or 25 of the coaxial cable 10 or 12 is connected via capacitors 6 and 7 or 13 and 15 to power supply input terminals 28 and 29 or 38 and 39 of the high-input impedance amplifier 8 or 16. The power supply input terminals 28 and 29 or 38 and 39 of the amplifier 8 or 16 to be connected to grounded power supplies 1 and 2 or 20 and 21 are all connected, via resistors 3 and 4 or 18 and 19 of adequate value, to give the required suppression of common-mode signals.

Where an adequate selection of values of the capacitors 6, 7, 13 and 15 and the resistors 3, 4, 18, and 19 is made to realize practically usable accuracy of the impedance measuring instrument, the operating frequency expands over six decades. This frequency bandwidth is much wider than the value of about 3.5 decades in prior-art devices using transformers. Further, the required components can be resistors and capacitors of lower accuracy, and lower costs that can be found in suitable transformers then result.

FIG. 1 is a circuit diagram of a preferred embodiment of the invention, a pair of floating driver circuits for a component measuring device, and FIG. 2 is its equivalent circuit diagram presented for explanation purpose.

FIG. 1 depicts a current driver circuit of an impedance measuring instrument which is composed in a lateral symmetrical form about a device 11 under test, as a center of symmetry. Operations of both halves are symmetrical, and operation of the left half alone is explained. A signal source 5 is connected to an input terminal 27 of a high-input impedance amplifier 8. The two power supply input terminals 28 and 29 of the amplifier 8 are coupled to grounded D-C power supplies 1 and 2 via resistors 3 and 4 respectively and are energized.

The center conductor 22 of the coaxial cable 10 is coupled to an output terminal 36 of the amplifier 8 via a resistor 9. The outer conductor 24 of the cable 10 is coupled to each of two power supply input terminals 28 and 29 of the amplifier 8 via each of the capacitors 6 and 7, respectively.

The resulting equivalent circuit of the circuit shown in FIG. 1 is shown in FIG. 2. In FIG. 2, signal sources 5A and 17A provide amplified signals from the signal source 5 and 17. A resistor 30 is the sum of the resistor 9 and a parasitic resistor at the output of the amplifier 8, and the resistor 31 is a parallel combination of the resistors 3 and 4. A capacitor 32 is a parallel combination of the capacitors 6 and 7.

In the same manner, the resistor 33 is the sum of a resistor 14 and parasitic resistor at the output of an amplifier 16, and a resistor 35 is a parallel combination of resistors 18 and 19. A capacitor 34 is a parallel combination of capacitors 13, 15.

To make it easy to understand, the following device parameters are used.

(1) The output voltages of the voltage sources 5A and 17A are 1 V and 0 V, respectively.
(2) The impedance value of the device under test is 0 ohms.
(3) The resistors 30 and 33 have the same resistance as R1/2.
(4) The resistors 31 and 35 have the same resistance as R2/2.
(5) The capacitors 32 and 34 have the same capacitance as 2C.
(6) The impedances of the center conductors 22 and 24 and the outer conductors 23 and 25 of the cables 10 and 12 are negligible.

The magnitude of the currents flowing through resistors 31 and 35 is $$K \ (=1/(1-j\omega \cdot C \cdot R2))$$

times a magnitude of currents flowing through the center conductors.

Where, $j^2 = -1$ and $\omega$ is an operating angular frequency, then if $\omega C \cdot R2$ is selected as large enough, current flowing through the resistors 31 and 35 goes small enough and the currents flowing through the center conductors 22 and 24 of the cables 10 and 12, the currents are the same in magnitude and opposite in direction.

In one embodiment of the invention, $$R2 = 25\Omega,$$

$$C = 100\mu F, \omega = 2 \times 10^3 \pi - 2 \times 10^8 \pi,$$

then, $$|K| = 0.64 \times 10^{-1} - 0.64 \times 10^{-6},$$

which are very effective values.

Figure 3:
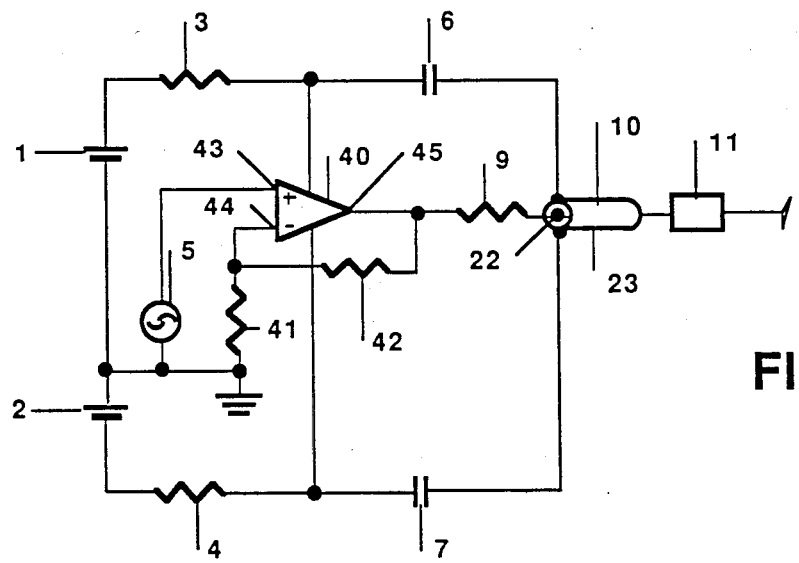
FIG. 3 is a circuit diagram of a modified form of floating driver circuit also embodying the principles of the invention.

The circuit of FIG. 3

FIG. 3 shows another embodiment of the invention. In FIG. 3, the same reference numbers, where pertinent, are assigned to the elements and devices which have the same functions in similar performances as in FIG. 1. However, in FIG. 3, a high-input impedance differential amplifier 40 is used to replace the amplifier 8 of FIG. 1. The signal source 5 is coupled to the non-inverting input of the amplifier 40 and resistors 41 and 42 are coupled between its non-inverting input terminal 43 and ground and between its non-inverting terminal 44 and its output terminal 45 respectively.

In view of the invention, it is desirable to choose the value of the resistor 41 equal to or larger than the value of the resistors 3 and 4.

Figure 4:
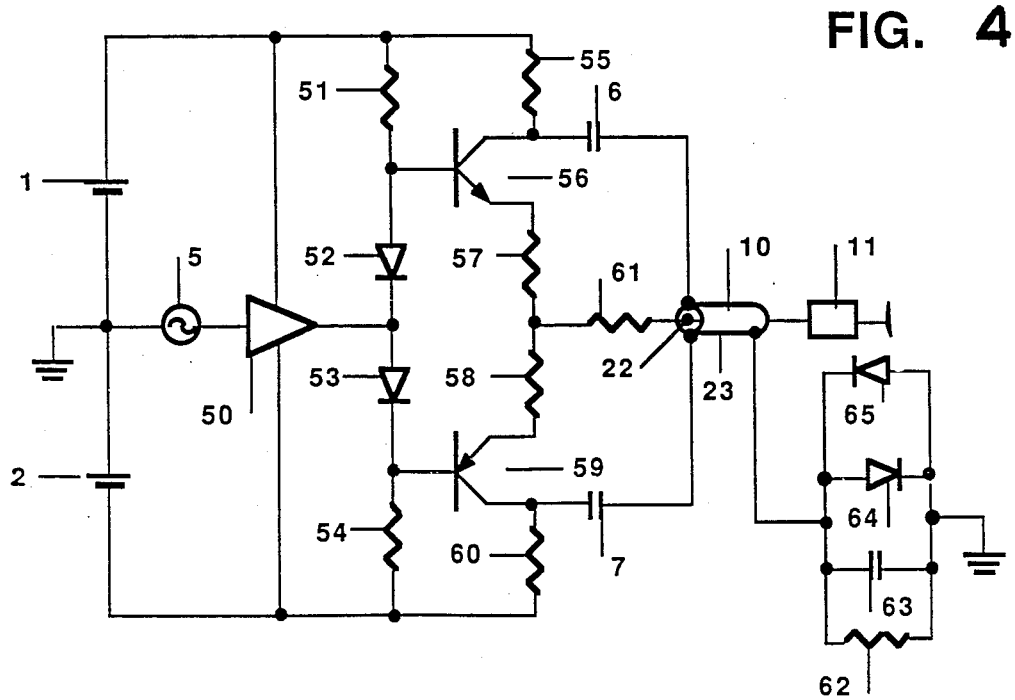
FIG. 4 is a circuit diagram of another modified form of floating driver circuit again embodying the principles of the invention.

The circuit of FIG. 4

FIG. 4 shows a third embodiment of the invention. In FIG. 4, the same reference numbers are assigned to the elements and devices which have the same function and similar performances as in FIG. 1. In FIG. 4, an amplifier 50 replaces the amplifier 8 of FIG. 1. The amplifier 50, however, need not be high in its input impedance. In FIG. 4, an additional resistor 51, a diode 52, a diode 53, and a resistor 54 are connected in series in order and are coupled between the power supplies 1 and 2, and a buffer amplifier (composed of transistors 56 and 59 and resistors 57 and 58) is biased through them. The junction of the resistor 51 and the diode 52 is coupled to the base of the NPN transistor 56; the junction of the resistor 54 and the diode 53 is coupled to the base of the PNP transistor 59. The junction of the diodes 52 and 53 is coupled to the output terminal of the amplifier 50, and the transistors 56 and 59 are driven. The series-connected resistors 57 and 58 are across the coupled emitters of the transistors 56 and 59, and the junction of the resistors 57 and 58 is connected to the center conductor 22 of the coaxial cable 10 via a resistor 61.

On the other hand, the collector of the transistor 56 is coupled to the power supply 1 via the resistor 55 and to the outer conductor 23 of the coaxial cable 10, via the capacitor 6. In a similar manner, the collector of the transistor 59 is coupled to the power supply 2 via the resistor 60 and to the outer conductor 23 of the coaxial cable 10, via the capacitor 7. The impedances of both base input terminals of the transistors 56 and 59 are equal to or higher than the impedances of the resistors 55 and 60; the buffer amplifier is a high input impedance amplifier.

Further, in FIG. 4, a resistor 62, a capacitor 63, and a parallel but reverse directional combination of diodes 64 and 65 are all connected in parallel and coupled between the outer conductor 23 of the coaxial cable 10 and ground. These fix the D-C potential level of the outer conductor 23 of the coaxial cable 10 and reduce noise. The impedance of the parallel combination should be selected sufficiently high, usually higher than 10Ω. For example, the value of the resistor 62 is preferably 1 kΩ, and the value of the capacitor 63 is preferably 0.1 μF.

There may be various modifications in the embodiments mentioned heretofore. For example, in FIG. 1, the object of the invention may be accomplished without the capacitor 6. A combination of the different embodiments may also provide an advantage of the invention.

Further, where the D-C supply voltages feeding the amplifier 8 may be reduced by insertion of the resistors 3 and 4, voltage regulator circuits may be inserted between the power supply input terminals and the junctions of the resistors 3 and 4 and the capacitors 6 and 7, each raising outputs of power supplies 1 and 2 to higher voltages, that can be done without loss of advantages of the invention.

It is apparent from the embodiments mentioned above in detail that a wide band and lower cost floating driver circuit is provided with lower cost resistors and capacitors and without using transformers. Especially, where decoupling resistors and capacitors become inevitable, the grounding terminals of the capacitors may be simply disconnected and reconnected to the outer conductor of the coaxial cable to provide the preferred effects of the invention.

What is claimed is:

1. A floating driver circuit comprising,
power supply means,
a signal source, connected to said power supply means,
amplifier means provided with input terminal means connected to said signal source, a plurality of power supply terminal means, and signal output terminal means,
at least one resistor for each said power supply terminal means, connected to said power supply means so that direct current flows from said power supply means into said power supply terminal means,
at least one capacitance means connected to said power supply terminal means, and
a cable comprising first and second conductors, said first conductor being connected to said signal output terminal means, said second conductor being connected to said power supply terminal means through said capacitance means.

2. The floating driver circuit of claim 1 wherein said cable is a coaxial cable, said first conductor being a central conductor and said second conductor being an outer conductor.

3. The floating driver circuit of claim 1 wherein said signal source is connected between a pair of power supplies constituting said power supply means.

4. The floating driver circuit of claim 1 wherein each said resistor is positioned between a separate power supply portion of said power supply means and a said power supply terminal means.

5. The floating driver circuit of claim 1 wherein said capacitance means comprises a plurality of capacitors, each connected between said second conductor and a separate said power supply terminal means.

6. The floating driver circuit of claim 1 having
a grounded first additional resistor having a first grounded end connected to said signal source at the same side thereof as said power supply means, said first additional resistor having a second end,
said amplifier means having a pair of input terminals, a first input terminal being connected to said power supply means through said signal source, and a second input terminal connected to said power supply means through said first additional resistor, and
a second additional resistor having one end connected between said second input terminal and said first additional resistor and a second end connected to said signal output terminal means.

7. An electrical component measuring device comprising a pair of floating driver circuits of claim 1 identical to each other the first conductor of both said cables being adapted to be joined by opposite ends of a said component to be measured.

8. A floating driver circuit comprising,
power supply means comprising a pair of power supply portions,
a signal source, connected to said power supply means between said power supply portions,
amplifier means provided with input terminal means connected to said signal source, two power supply terminals, and signal output terminal means,
first and second resistors each connected to a different of said power supply portions and through which direct current flows into one said power supply terminal,
first and second capacitors each connected to a different said power supply terminal, and
a coaxial cable comprising first and second conductors, said first conductor being connected to said signal output terminal, said second conductor being connected to said power supply terminals through respective said capacitance means.

9. A floating driver circuit comprising,
a pair of identical power supply members connected together serially,
a signal source, connected between said two power supply members at a first end and having a second end,
a differential amplifier provided with a pair of input terminals, a first input terminal being connected to the second end of said signal source, and a second input terminal, said amplifier also having first and second power supply terminals, and a signal output terminal, first and second resistors each of which is connected to a different said power supply member for direct current flow from one said power supply member to a different one of said power supply terminals, a third resistor having one end connected between said pair of power supply members and also to ground and connected at another end to said second input terminal, a fourth resistor connected between (1) said second end of said third resistor and said second input terminal and (2) to said signal output terminal, a coaxial cable comprising first and second coaxial conductors, said first conductor being connected to said signal output terminal, and a pair of capacitors, said second conductor being connected to each of said power supply terminals through respective said capacitors.

10. A floating driver circuit comprising, first and second identical power supply members connected together serially, a signal source, connected between said first and second power supply members at a first end and having a second end, an amplifier provided with an input terminal connected to, said second end of said signal source, said amplifier also having first and second power supply terminals that are respectively connected to said first and second power supply members; and a signal output terminal, first and second resistors respectively connected at a first end to said first and second power supply members and respectively connected to said first and second power supply terminals, said resistors also having a second end, first and second diodes connected at one end to said second ends of said first and second resistors respectively, and connected at a second end to said signal output terminal, first and second transistors with respective bases connected respectively between said first diode and said first resistor and between said second diode and said second resistor, third and fourth resistors respectively having one end connected to said first and second power supply members and a second end respectively connected to the emitter of said first and second transistors, said first and second transistors and said third and fourth resistors constituting a buffer amplifier, fifth and sixth resistors respectively connected at one end to said first and second transistors and at a second end to a common conductor, a coaxial cable comprising first and second coaxial conductors, said first conductor being connected via a seventh resistor to said common conductor, and first and second capacitors, respectively connected at one end to said second conductor and connected at a second end to the collectors of said first and second transistors respectively and between said emitter and said third and fourth resistors, respectively.

11. The floating driver circuit of claim 10 having also, in parallel with each other and connected to said second conductor of said coaxial cable, an eighth resistor, a third capacitor, and third and fourth diodes, mutually reversed in direction.

12. A component measuring device comprising:

component means to be measured, a pair of identical floating driver circuits, each having power supply means, a signal source connected to said power supply means, an amplifier provided with an input terminal connected to said signal source and therethrough to said power supply means, a pair of power supply terminal means, and a signal output terminal, a pair of resistors through each of which direct current flows from said power supply means into one said power supply terminal means, a pair of capacitors each connected to a said power supply terminal, and a coaxial cable comprising first and second conductors, one end of said first conductor being connected to said signal output terminal, said second conductor having one end connected to each said power supply terminal means through one said capacitor, said coaxial cables' conductors each having a second end, the second conductor of each said floating driver circuit being connected to each other at their second ends, the second end of each said first conductor being connectable to opposite ends of said component means.

13. The component measuring device of claim 12 wherein said signal source of each said floating driver circuit is connected between a pair of power supplies constituting said power supply means.

14. The component measuring device of claim 12 wherein in each said floating driver circuit each said resistor is positioned between a separate power supply portion of said power supply means and a said power supply terminal means.

15. The component measuring device of claim 14 having in each said floating driver circuit:

a grounded first additional resistor having a first grounded end connected to said signal source at the same side thereof as said power supply means, said first additional resistor having a second end, said amplifier means being a differential amplifier having a pair of input terminals, a first one being connected to said power supply means through said signal source, and a second input terminal connected to said power supply means through said first additional resistor, and a second additional resistor having one end connected between said second input terminal and said first additional resistor and a second end connected to said signal output terminal means.

16. The component measuring device of claim 12 wherein each said floating driver circuit comprises, first and second identical power supply members connected together serially as said power supply means, said signal source being connected between said first and second power supply members at a first end and having a second end, said amplifier having its input terminal connected to said second end of said signal source said amplifier also having first and second power supply terminals as said power supply terminal means respectively being connected to said first and second power supply members, first and second resistors being respectively connected as said pair of resistors at a first end to said first and second power supply members and respectively connected to said first and second power supply terminals, said resistors also having a second end, first and second diodes connected at one end to said second ends of said first and second resistors respectively, and connected at a second end to said signal output terminal, buffer amplifier means comprising first and second transducers with respective bases connected respectively between said first diode and said first resistor and between said second diode and said second resistor, and third and fourth resistors respectively having one end connected to said first and second power supply members and a second end respectively connected to the emitter of said first and second transistors, fifth and sixth resistors respectively connected at one end to said first and second transistors and at a second end to a common conductor, said first conductor of said coaxial cable being connected via a seventh resistor to said common conductor, and first and second capacitors, constituting said pair of capacitors respectively being connected at one end to said second conductor and connected at a second end to the emitters of said first and second transistors respectively and between said emitter and said third and fourth resistors, respectively.

17. The component measuring device of claim 16 having also, in parallel with each other and connected to said second conductor of said coaxial cable, an eighth resistor,
a third capacitor, and
third and fourth diodes, reversed with respect to each other.

* * * * *

UNITED STATES PATENT AND TRADEMARK OFFICE
CERTIFICATE OF CORRECTION

PATENT NO. : 4,795,962

DATED : January 3, 1989

INVENTOR(S) : Kouichi Yanagawa; Kazuyuki Yagi

It is certified that error appears in the above-identified patent and that said Letters Patent is hereby corrected as shown below:

Column 7, line 25, "nected to, said second end of said signal source,"

-- nected to said second end of said signal source,--

Signed and Sealed this

Thirty-first Day of October, 1989

Attest:

DONALD J. QUIGG

*Attesting Officer*  *Commissioner of Patents and Trademarks*